(12) United States Patent
Luich

(10) Patent No.: US 7,982,500 B2
(45) Date of Patent: Jul. 19, 2011

(54) LOW-NOISE PECL OUTPUT DRIVER

(75) Inventor: Thomas M Luich, Puyallup, WA (US)

(73) Assignee: Glacier Microelectronics, Santa Clara, CA (US)

( * ) Notice: Subject to any disclaimer, the term of this patent is extended or adjusted under 35 U.S.C. 154(b) by 0 days.

(21) Appl. No.: 12/754,176

(22) Filed: Apr. 5, 2010

(65) Prior Publication Data

US 2010/0253389 A1    Oct. 7, 2010

Related U.S. Application Data

(63) Continuation-in-part of application No. 11/949,621, filed on Dec. 3, 2007, now Pat. No. 7,768,309.

(51) Int. Cl.
*H03K 19/0175*    (2006.01)

(52) U.S. Cl. ............... 326/81; 326/66; 326/68; 326/73; 326/86; 327/109; 327/333

(58) Field of Classification Search .................. 326/63, 326/66, 68, 73, 80–83, 86; 327/108–109, 327/333
See application file for complete search history.

(56) References Cited

U.S. PATENT DOCUMENTS

| | | | | |
|---|---|---|---|---|
| 6,043,699 | A * | 3/2000 | Shimizu | 327/333 |
| 6,556,061 | B1 * | 4/2003 | Chen et al. | 327/333 |
| 7,053,656 | B2 * | 5/2006 | Seo | 326/68 |
| 7,176,720 | B1 * | 2/2007 | Prather et al. | 326/80 |
| 7,183,817 | B2 * | 2/2007 | Sanchez et al. | 327/112 |
| 7,268,588 | B2 * | 9/2007 | Sanchez et al. | 326/68 |
| 7,480,191 | B2 * | 1/2009 | Walker et al. | 365/189.11 |
| 7,619,460 | B2 * | 11/2009 | Mei et al. | 327/333 |
| 7,768,308 | B2 * | 8/2010 | Maede et al. | 326/68 |
| 7,768,309 | B2 * | 8/2010 | Luich | 326/81 |
| 2005/0024088 | A1 * | 2/2005 | Lee | 326/81 |
| 2005/0189961 | A1 * | 9/2005 | Frans et al. | 326/30 |
| 2009/0002027 | A1 * | 1/2009 | Lee | 326/80 |

* cited by examiner

*Primary Examiner* — Jason M Crawford
(74) *Attorney, Agent, or Firm* — Useful Arts

(57) ABSTRACT

An integrated circuit output driver is provided that exhibits improved performance and signal integrity. In one embodiment, circuitry for producing an oscillatory output signal having a peak voltage of V volts uses MOS transistor circuitry transistors of which are designed for a maximum port-to-port voltage of substantially less than V volts. A first inverter chain is coupled to an input signal to produce a predriver output signal. A second inverter chain of multiple of inverters including a first inverter produces a driver output signal. Circuitry is provided for AC-coupling the predriver output signal to the second inverter chain, it being configured to translate the predriver output signal to a higher voltage range to produce a translated predriver output signal. A driver transistor is controlled using the driver output signal to produce the oscillatory output signal, and circuitry coupled to the driver output transistor ensures that no port-to-port voltage of the driver output transistor exceeds the maximum port-to-port voltage.

24 Claims, 17 Drawing Sheets

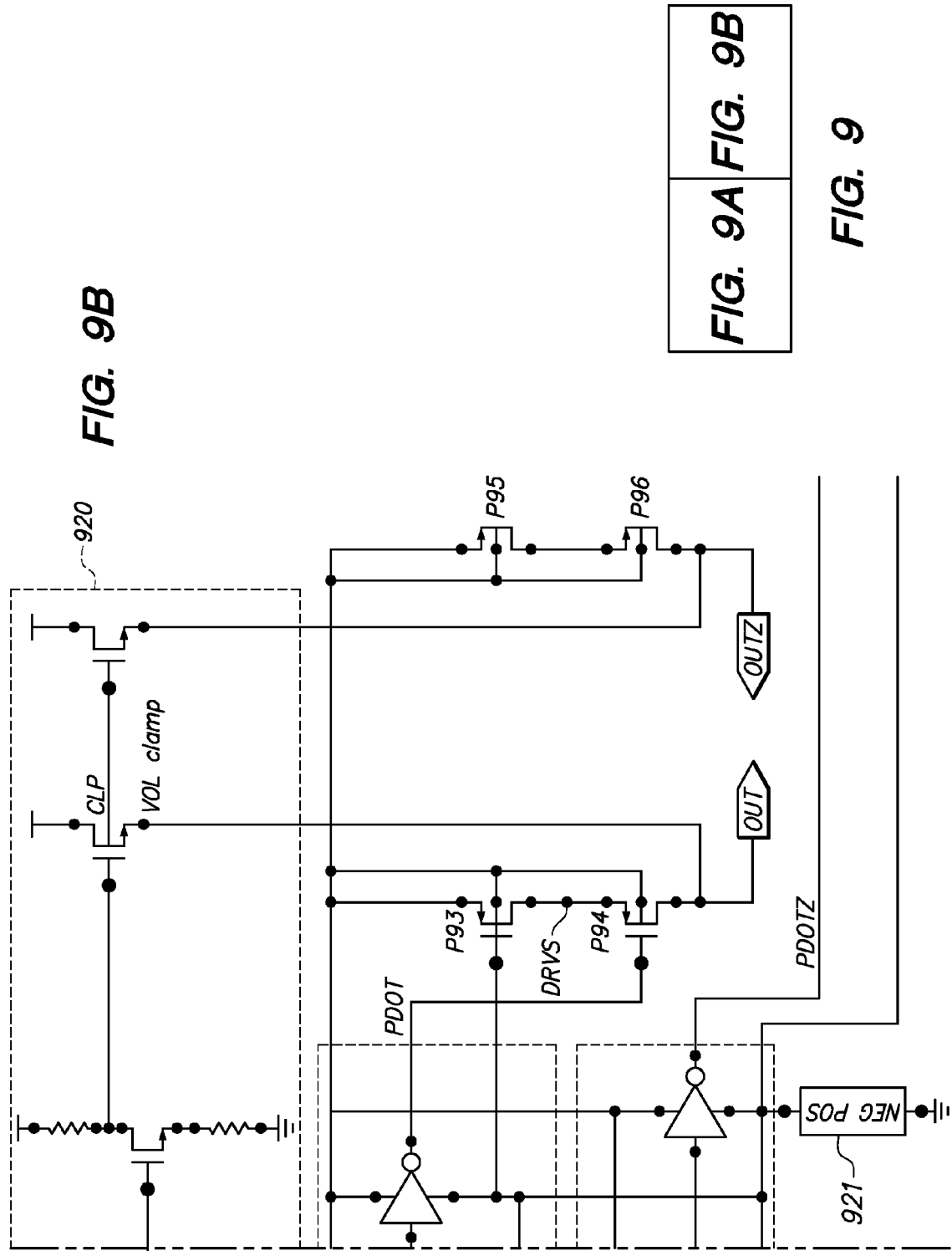

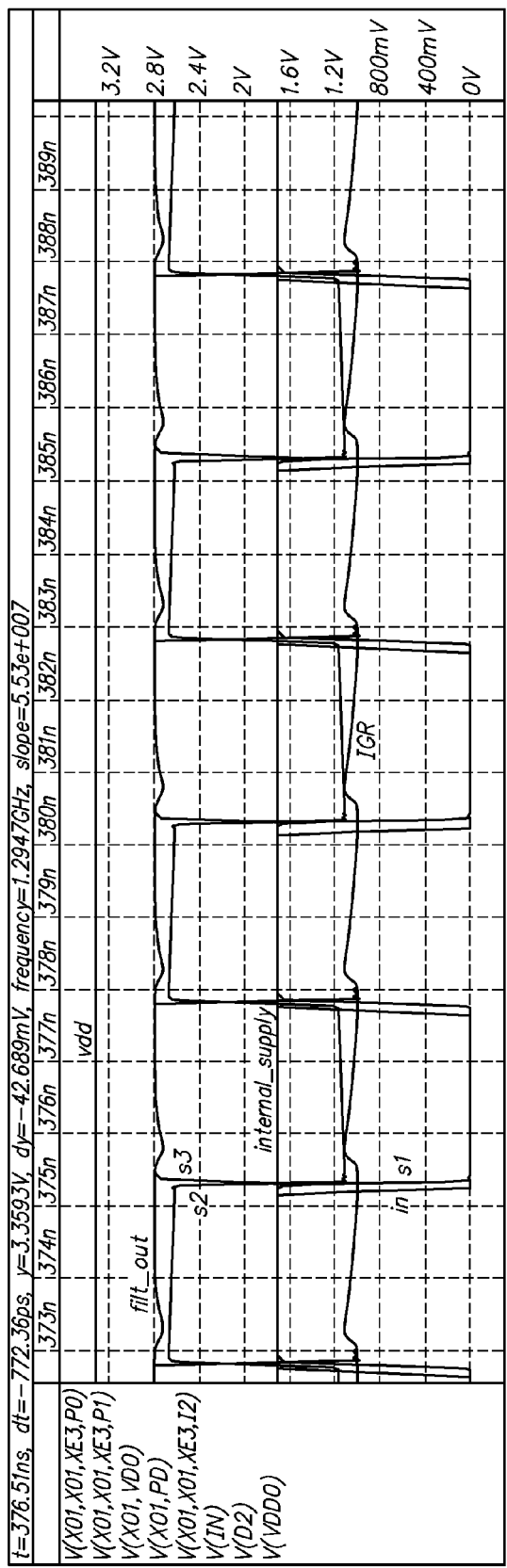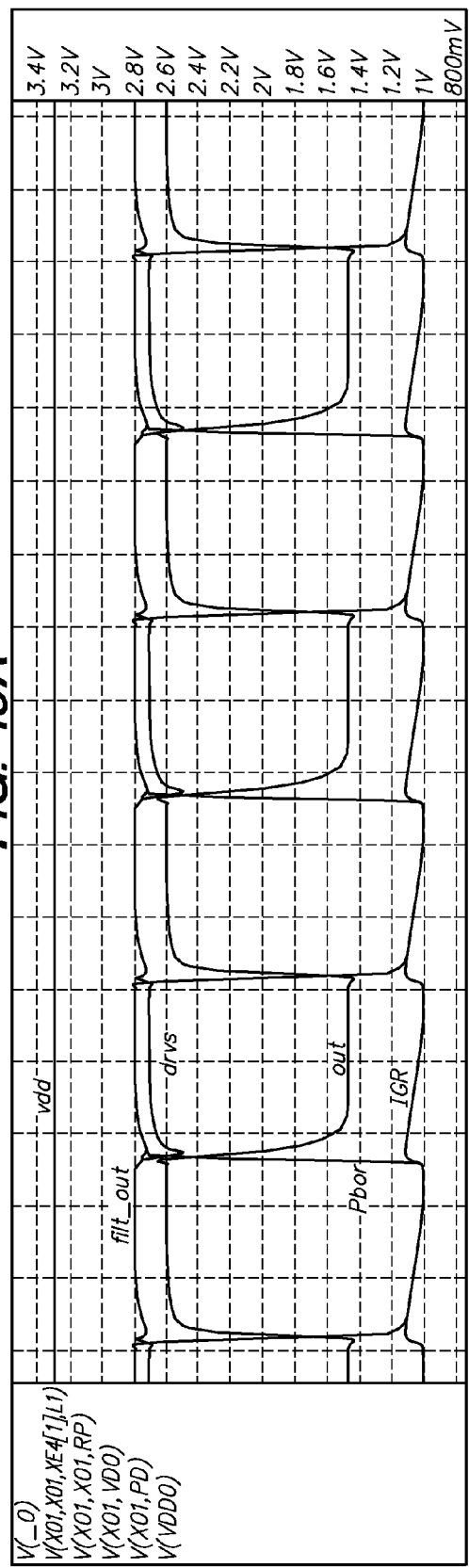
FIG. 16A
FIG. 16B

LOW-NOISE PECL OUTPUT DRIVER

RELATED APPLICATIONS

This application is a continuation-in-part of U.S. Ser. No. 11/949,621 of the same inventor filed Dec. 3, 2007 now U.S. Pat. No. 7,768,309, incorporated herein by reference.

Emitter Coupled Logic (ECL) has historically been used for high performance systems due to its high frequency, low swing, and differential signal. As the name implies, ECL was originally created using bipolar technology, and its output characteristics are particularly well-suited for bipolar transistors. Generally, due to its high cost and power, it was only used for the highest performing systems. Early ECL systems used ground as the positive rail, and a negative voltage as the negative rail, while new systems generally use a positive voltage for the positive rail, and ground for the negative rail. This Positive-voltage ECL is generally referred to as PECL.

As IC technology has advanced, CMOS performance has increased rapidly, mainly due to transistor scaling. As transistors have scaled downward, their performance has increased, but their operating voltage has scaled downward in the same fashion. The typical CMOS I/O cell, or driver, operates rail-to-rail at a maximum frequency of about 200 MHz, although there are many instances of high performance systems using CMOS that have exceeded this performance. It is desirable for CMOS-based high performance systems to adopt the high performance I/O aspects of ECL. However, the power supply levels for these systems have not scaled at the same rate as CMOS transistors. High performance CMOS systems typically operate at a positive 3.3V or more recently at 2.5V.

High performance CMOS circuits generally are not able to interface to PECL or other logic standards where the system power supplies operate at voltages above the transistor voltage limitations. For example, 0.18 u CMOS transistors are typically limited to about 2V operating voltage (in one instance, 1.8V, for example), significantly lower than most system supplies. All port-to-port voltages (gate-to-source, gate-to-drain, source-to-drain, gate-to-bulk) applied to the transistor must be less than this value. To mitigate the supply mismatch between systems and transistors, most fabrication facilities have employed dual gate oxide thickness processes that allow thick gate transistors with 3.3V capability, while maintaining the high performance, thin gate, low voltage transistor. The thicker gate transistor is then used as an interface to the high voltage board level supply, while the thin gate transistors are regulated on die to their required supply voltage.

The use of thick gate transistors as the interface between low voltage thin gate transistors and the system supply presents a problem for high output frequencies. In particular, the 3.3V capability of thick gate transistors implies a lower-performance gate length, typically 0.35 u. Therefore, for high voltage systems requiring thick gate transistors for interfacing, the upper frequency range becomes much more limited than a lower voltage system using thin gate transistors. Other problems, including driver size, power consumption and power supply noise, have also limited the performance of MOS output drivers.

Referring to FIG. 1, a diagram is shown of a known CMOS PECL driver with predriver and translator. Since the driver must drive large loads, predriver stages 101a, 101b are used to connect smaller, high frequency internal devices to the output stage 110. The predrivers 101a, 101b are formed as chains of inverters that supply added drive from one stage to the next, amplifying load driving capability up to the ability to drive the very large output stage. Additionally, as the internal circuits use thin gate transistors operating at a lower power supply, level translators 103a, 103b are used such that lower voltage internal circuits 105a, 105b can drive the predrivers.

The output stage 110 is the NMOS equivalent of a bipolar ECL gate. Differential input gates N1, N2 have their drains coupled through respective resistors R1 and R2 to VDD. Sources of the input gates N1, N2 are coupled to a current source I that is in turn coupled to ground. A differential signal (IN, INZ) drives the differential input gates N1, N2, whose drains drive output transistors (source followers) N3, N4. Drains of the output source followers are coupled to VDD.

The output transistors N3, N4 are terminated externally by 50 ohms (RTERM1, RTERM2) to a voltage VDD_2 equal to VDD−2V, which is the requirement for PECL/ECL. The output levels at O and IO, which are 180 degrees out of phase with each other, are set by the voltage at the output source follower's gate minus the threshold voltage Vt of the transistor. The high level (VOH) of any one side of the output occurs when the transistor of the differential pair is off. In that case, the gate of the output transistor associated with the off transistor is at VDD, and the output voltage is therefore VDD−Vt. The transistor must then source 24 mA to the load. The low level (VOL) of any one side of the output occurs when the transistor of the differential pair is on. In that case, the gate of the output transistor associated with the on transistor is at VDD minus the IR drop created by the current source and the resistor R1 or R2. The output voltage is therefore VDD−IR−Vt. Ideally, Vt would be about 800 mV or less. However, since the Vt of the source followers is generally greater than 800 mV, a lower Vt is required, which can be supplied by processes with having low Vt options. Note that all transistors in this case have terminal voltages (including bulk) that can equal the VDD of the system supply, implying the need for thick gate devices.

Alternatively, the output stage may use PMOS transistors as shown in FIG. 2. In this alternative, a PMOS differential pair P3, P4 is used, eliminating the need for low Vt transistors. In this case the gates of the PMOS transistors are switched to voltages such that one transistor sources 24 mA (for VOH) to the load resistor, while the other supplies 4-8 mA to the load. Both currents are supplied by a current source made up of a current source I2 and transistors P1 and P2. The output levels are then determined by VDD−2V+IR of the load resistor, as follows:

$$VOH = VDD-2V+24\text{ ma}*50 = VDD-800\text{ mV}$$

$$VOL = VDD-2V+4\text{ ma}*50 = VDD-1.8V$$

In this case, the output transistors P3, P4 can have high voltage across the gate to drain terminals if the external pin is brought to ground, requiring thick gate transistors. All of the transistors P1-P4 are therefore thick gate transistors.

A diagram of the translator 103 of FIG. 1 is shown in FIG. 3. An input signal INZ is applied to a two-stage inverter chain INV1, INV2 formed from thin-gate transistors and having a reduced supply voltage VDD_INTERNAL. First and second output branches are provided, each including a P transistors and an N transistor. A P transistor P31 has its source connected to VDD and its drain connected to the drain of an N transistor N31, which has its source connected to ground. A P transistor P32 has its source connected to VDD and its drain connected to the drain of an N transistor N32, which has its source connected to ground. The transistor N31 has its gate connected to the output of the first inverter stage INV1. The transistor N32 has its gate connected to the output of the second inverter stage INV2. The gates of the transistors P31 and P32 are cross-coupled. An output signal OUT is taken at the drain of the transistor N32. When INZ is HIGH, the transistor N31 is turned OFF and the transistor N32 is turned ON, connecting the output signal OUT to ground. The transistor P31 is turned ON, and the transistor P32 is turned OFF. When INZ is LOW, the transistor N31 is turned ON and the transistor N32 is turned OFF. The transistor P31 is turned OFF, and the transistor P32 is turned ON, connecting the output signal to VDD. The inverters INV1 and INV2 are formed by thin-gate transistors. All of the other transistors are thick-gate transistors.

Many high performance systems require low noise circuits. Noise can be seen as "jitter" on any edge in the output. Causes of jitter can be internal timing inaccuracies, phase noise, spurious frequencies found in the spectrum, etc. FIG. 4 shows an example of spurious tones (frequencies) found in the output spectrum of a known CMOS driver. The desired frequency is centered on the plot, and the spurious tones are found at offsets of ~20 and ~40 MHz. These spurious tones (spurs) supply unwanted energy at frequencies other than the desired frequency, causing jitter.

U.S. Patent Publication 2005/0024088 describes a buffer circuit that operates in accordance with CMOS level operation. It uses a low bandwidth thick gate unregulated level shifter to translate low voltage logic signals to a high voltage signal swing such that a high voltage predriver can be used to drive the output transistors. A high voltage signal is required in this scheme to drive the output transistors that must deliver high voltage signals.

An integrated circuit output driver is provided that exhibits improved performance and signal integrity. In one embodiment, circuitry for producing an oscillatory output signal having a peak voltage of V volts uses MOS transistor circuitry transistors of which are designed for a maximum port-to-port voltage of substantially less than V volts. A first inverter chain is coupled to an input signal to produce a predriver output signal. A second inverter chain of multiple of inverters including a first inverter produces a driver output signal. Circuitry is provided for AC-coupling the predriver output signal to the second inverter chain, it being configured to translate the predriver output signal to a higher voltage range to produce a translated predriver output signal. A driver transistor is controlled using the driver output signal to produce the oscillatory output signal, and circuitry coupled to the driver output transistor ensures that no port-to-port voltage of the driver output transistor exceeds the maximum port-to-port voltage.

Other features and advantages will be understood upon reading and understanding the detailed description of exemplary embodiments, found herein below, in conjunction with reference to the drawings, a brief description of which is provided below.

Figure 9A:
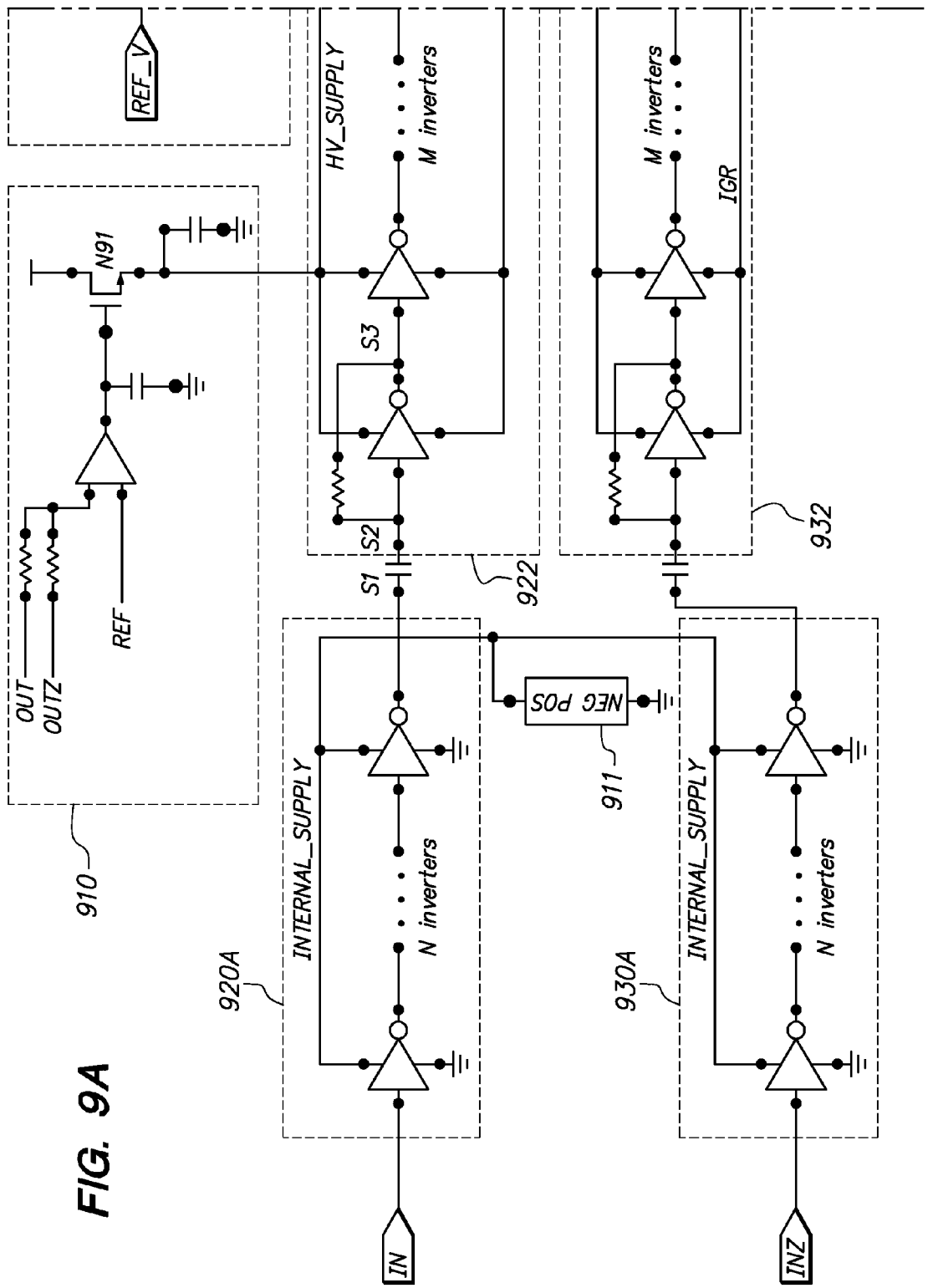
FIG. 9 is a diagram of a PECL output driver using only thin-gate transistors.

FIG. 16, including subordinate figures FIG. 16A and FIG. 16B, is a second waveform diagram illustrating operation of the circuit of FIG. 9.

There follows a more detailed description of the present invention. Those skilled in the art will realize that the following detailed description is illustrative only and is not intended to be in any way limiting. Other embodiments of the present invention will readily suggest themselves to such skilled persons having the benefit of this disclosure. Reference will now be made in detail to embodiments of the present invention as illustrated in the accompanying drawings. The same reference indicators will be used throughout the drawings and the following detailed description to refer to the same or like parts.

Figure 1:
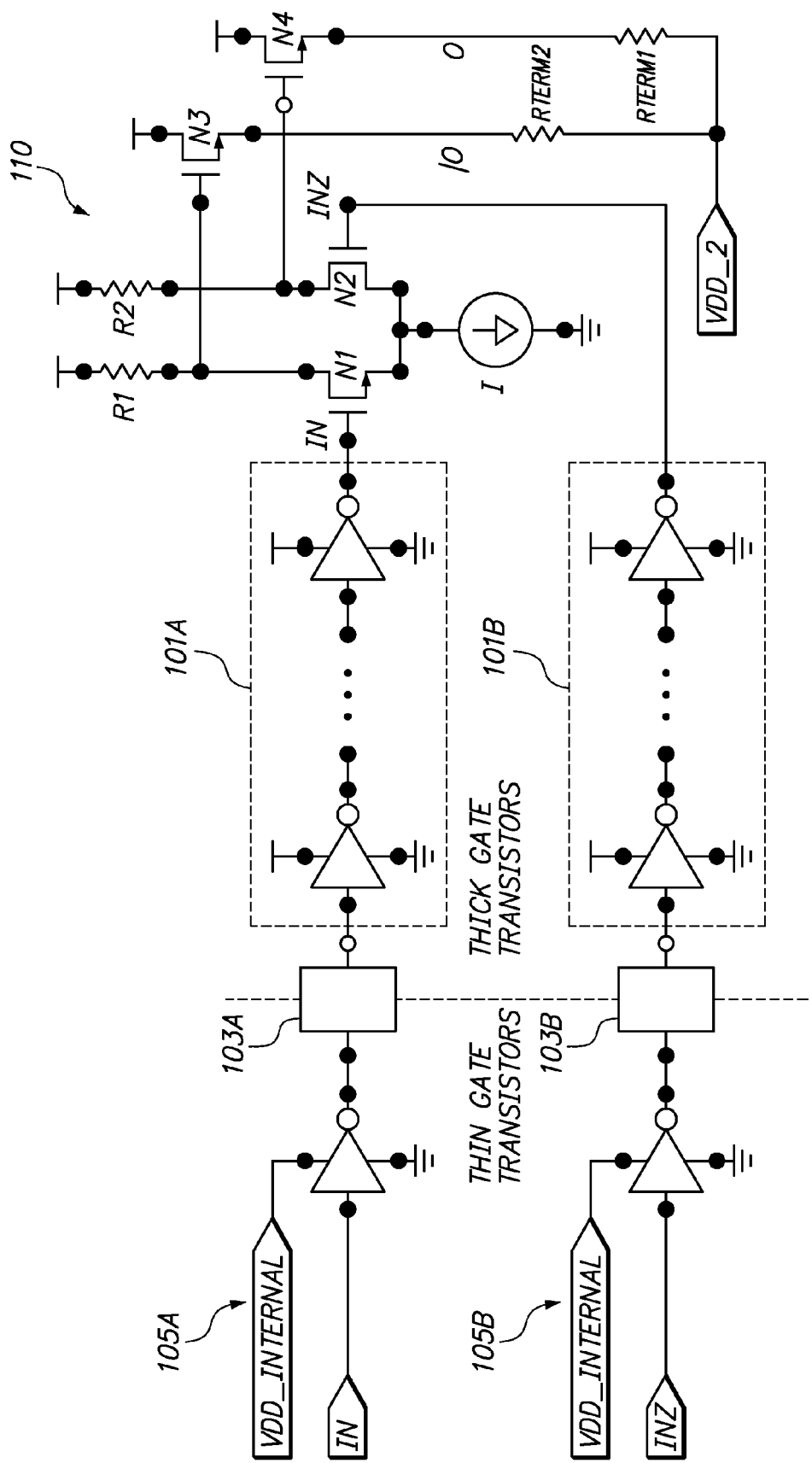
FIG. 1 is a diagram of a known PECL output driver.
Figure 2:
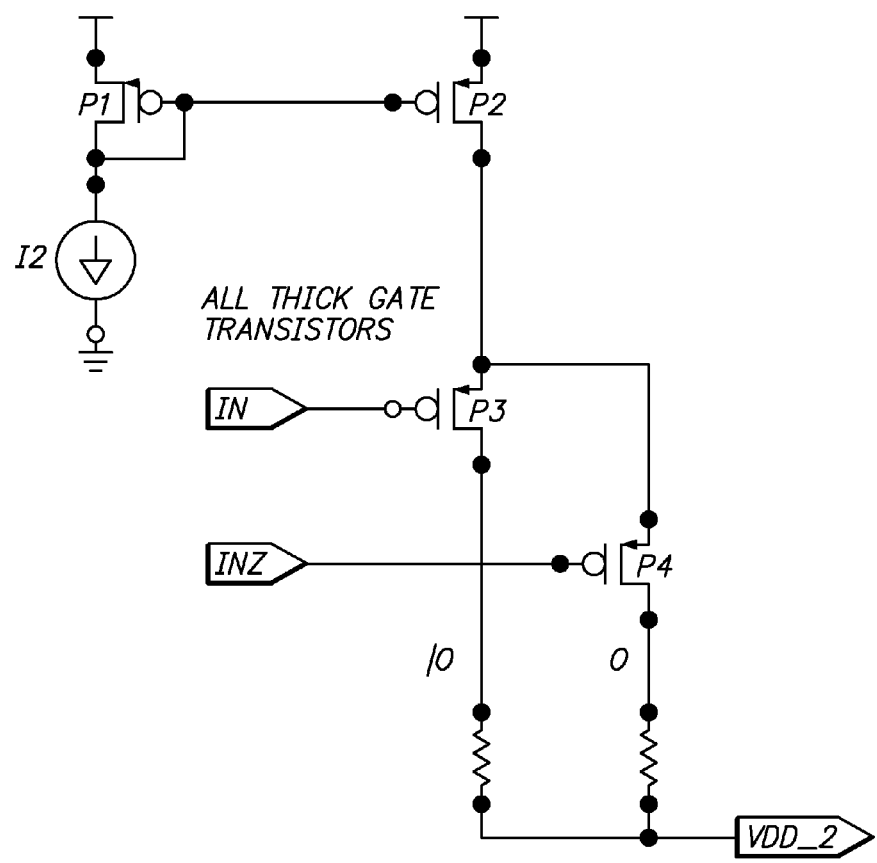
FIG. 2 is a diagram of a known alternative output stage.
Figure 3:
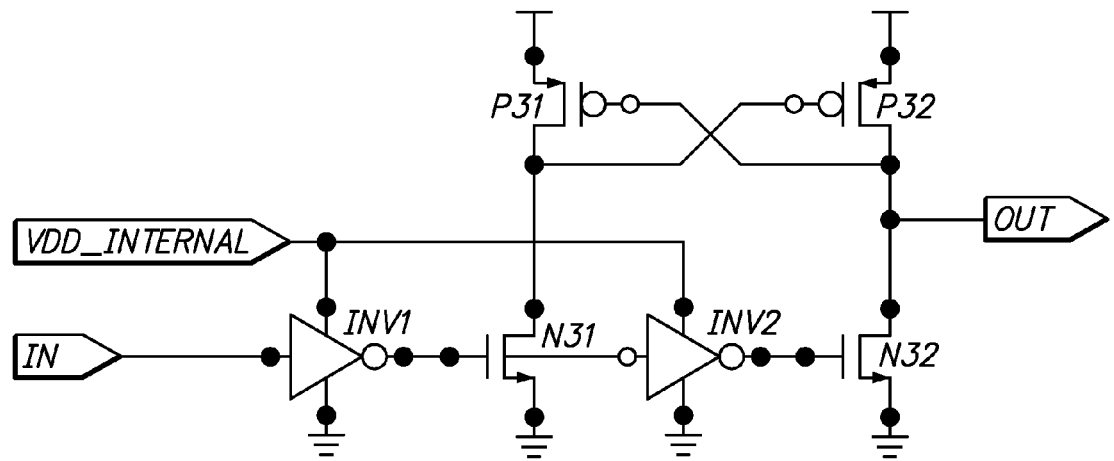
FIG. 3 is a diagram of the translator of FIG. 1.
Figure 4:
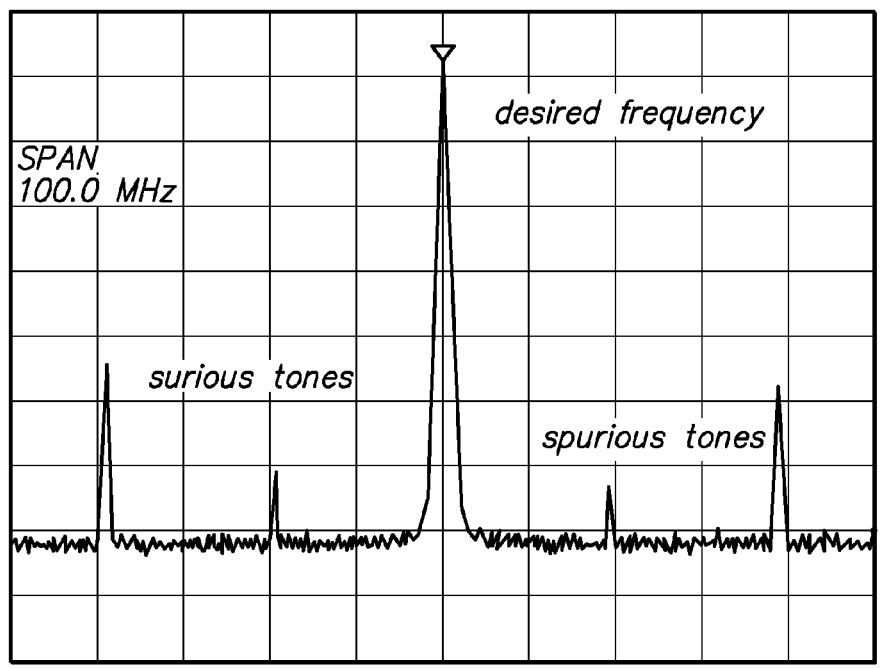
FIG. 4 is an output spectrum plot of a typical PECL output driver.
Figure 5:
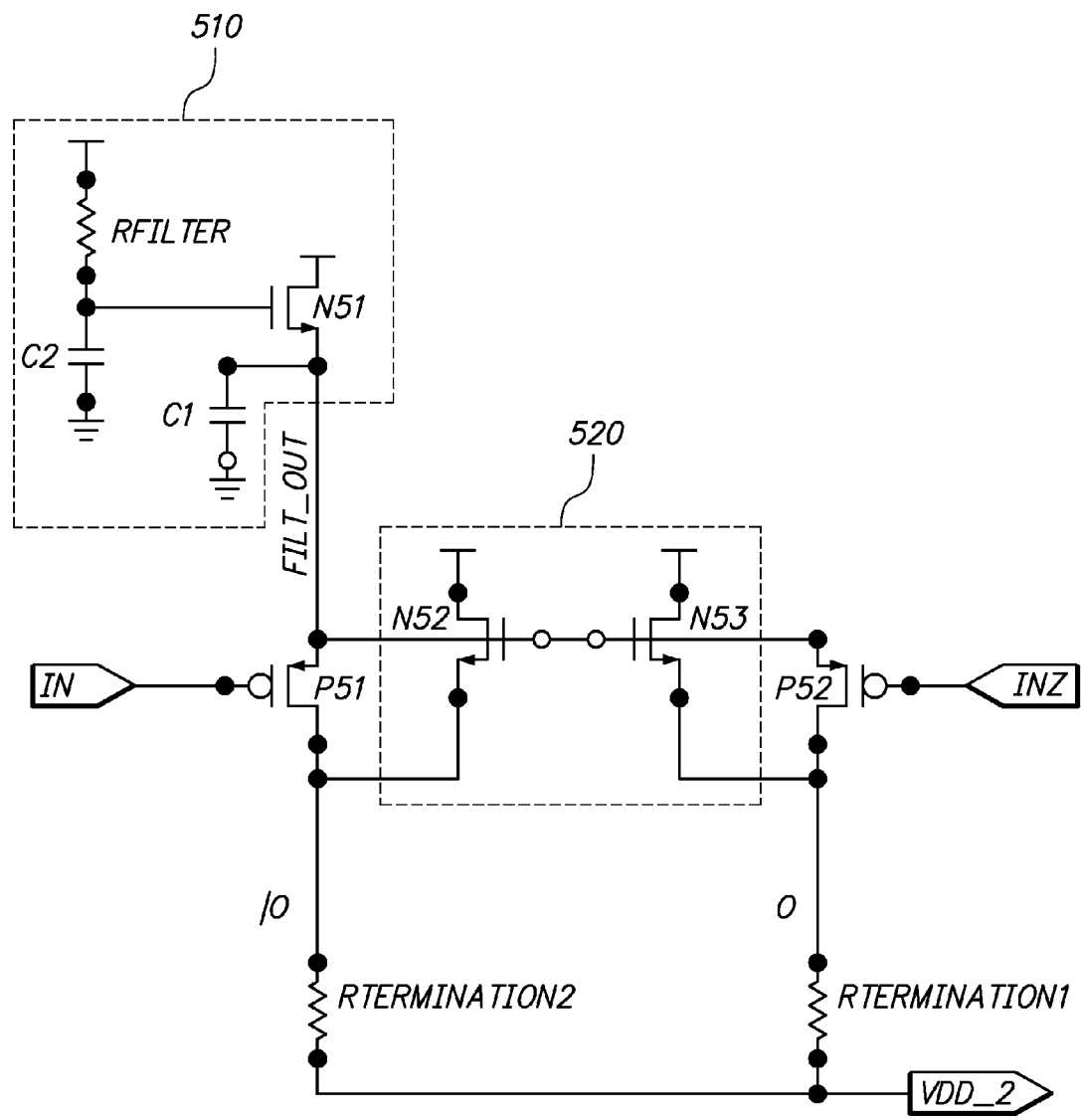
FIG. 5 is a diagram of the output stage of a supply-filtered PECL driver.

Referring now to FIG. 5, a diagram is shown of the output stage of a supply-filtered CMOS driver that provides a PECL output. The basic structure of the output stage is similar to that of FIG. 2. Transistors P51 and P52 form an input PMOS differential pair and have their drains coupled to a supply source FILT_OUT, described hereinafter. The transistor P51 has its gate connected to a non-inverted input signal IN. The transistor P52 has its gate connected to an inverted input signal INZ. Transistors P51 and P52 are sized according to the input voltages received from the predrivers. The transistors P51 and P52 have their drains coupled through respective termination resistors R2 and R1 to a voltage VDD_2 equal to VDD−2V. Output signals IO ("bar O") and O are taken at the drains of P51 and P52, which connect to the die pads. The output stage further includes an active RC supply filter 510 and a VOL clamp 520.

The active RC supply filter is formed by a large NMOS transistor N51, a resistor RFILTER, and capacitors C1 and C2. The NMOS transistor N51 is a zero or low-Vt transistor. The resistor RFILTER and the capacitor C2 are coupled in series, the resistor RFILTER being connected to VDD and the capacitor C2 being connected to ground. A node N between the resistor and the capacitor is connected to the gate of the transistor N51. The capacitor C1 is a shunt capacitor connected from the source of the transistor N51 to ground. Such an active RC filter can be used to provide approximately −30 dB of supply isolation at output frequencies of approximately 1-100 MHz, depending on the values of RFILTER and C2, as compared to approximately −8 dB without a supply filter.

When either P51 or P52 is off, the termination will tend to pull the output to VDD−2V. The VOL clamp 520 prevents this occurrence, and is formed by adding NMOS source follower clamp transistors N52 and N53 to the output pads to limit VOL to VDD−1.6V. Gates of the transistors N52 and N53 are connected to the source of the transistor P51. The transistors N52 and N53, like the transistor N51, are zero or low-Vt transistors.

Figure 6:
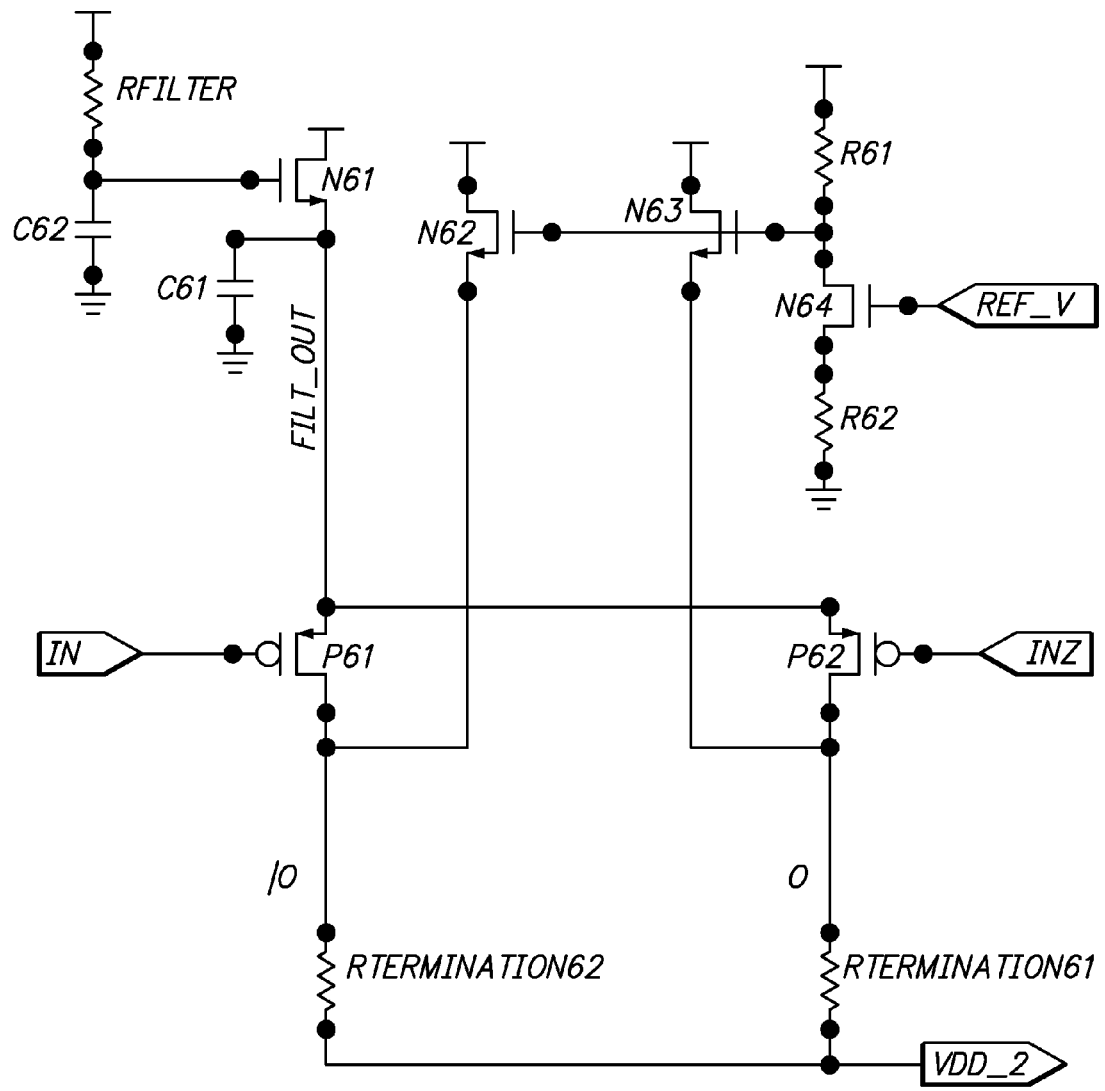
FIG. 6 is a diagram of an alternative output stage of a supply-filtered PECL driver.

Referring to FIG. 6, an alternative VOL clamping arrangement is shown. In this case, the gates of the VOL clamp transistors N62 and N63 are connected to a resistor R61 whose IR drop is connected to a current source constructed from a reference voltage REF_V, a transistor N64 and a resistor R62. The reference voltage REF_V may be provided by a bandgap or other reference voltage source. All of the transistors in FIG. 5 and FIG. 6 are thick-gate transistors.

Figure 7:
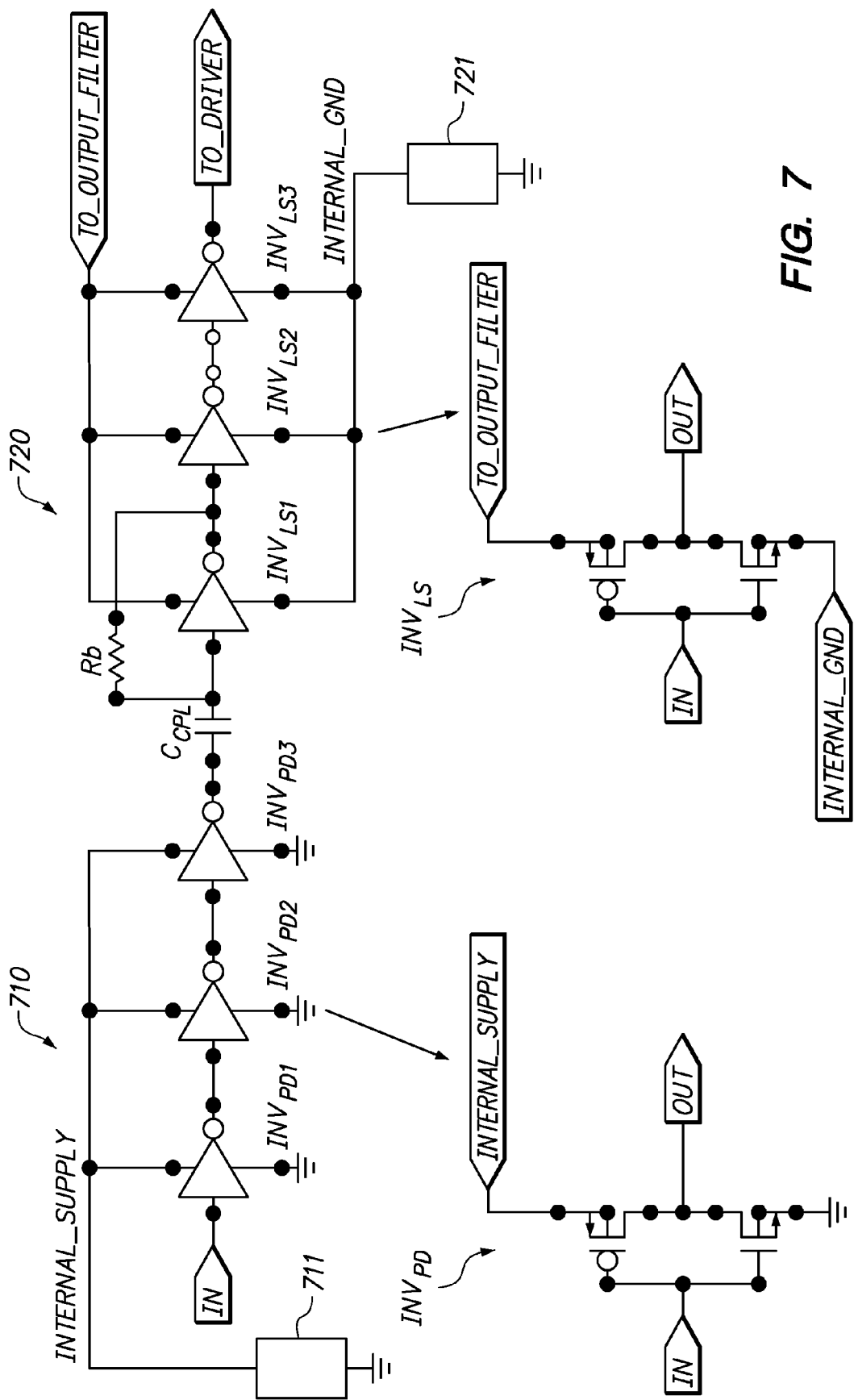
FIG. 7 is a diagram of predriver and level shifter circuits that may be used with the output stages of FIG. 5 and FIG. 6.

Referring to FIG. 7, a diagram is shown of predriver and level shifter circuits that may be used with the output stages of FIG. 5 and FIG. 6.

In the predriver 710 and level shifter 720, no thick gate transistors are used. Rather, within the predriver 710, thin gate inverters $INV_{PD}$ connected to normal ground have are connected to a regulator 711 that produces a supply voltage INTERNAL_SUPPLY. Within the level shifter 720, thin gate inverters $INV_{LS}$ operating at high voltage VDD have their ground connected to a regulator 721 that holds the total voltage across the gates to their maximum operating voltage (2V in the case of 0.18 u technology). The voltage INTERNAL_GROUND at the internal ground is VDD−2V for a 0.18 u technology. In order for this circuit to function without having gate-to-bulk voltages higher than the maximum, triple well transistors (bulk isolated) are used.

In the example of FIG. 7, the predriver 710 includes three series-connected inverters $INV_{PD1}$, $INV_{PD2}$, and $INV_{PD3}$ operating at the same supply voltage (INTERNAL_SUPPLY) as the internal circuits, and two inverters operating at the high voltage VDD. The level shifter 720 includes three series-connected inverters $INV_{LS1}$, $INV_{LS2}$, and $INV_{LS3}$ operating at the high voltage VDD and elevated ground. The inverter $INV_{LS1}$ is a biased inverter having a resistor Rb connected between input and output and acts as a level translator. It provides much higher bandwidth than the typical PMOS latch translator. The first three inverters of the predriver are AC coupled to the biased inverter by capacitor Ccp1 which drives the final two inverter stages of the level shifter. Of course, the number of inverters of both the predriver 710 and the level shifter 720 may be varied.

Figures 8, 8A:
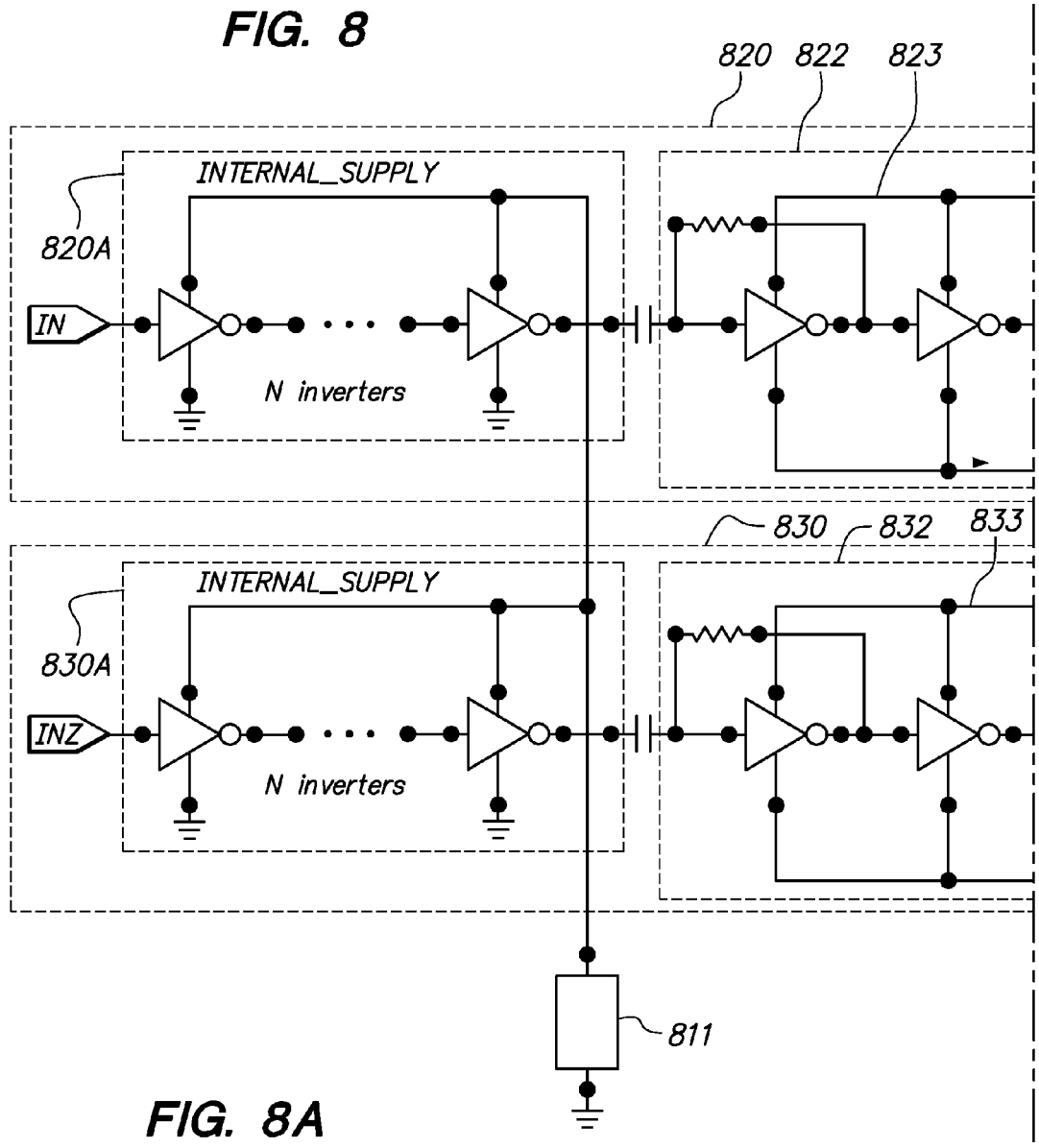
FIG. 8 is a diagram of a supply-filtered PECL driver with predriver and level shifter circuits.
Figure 8B:
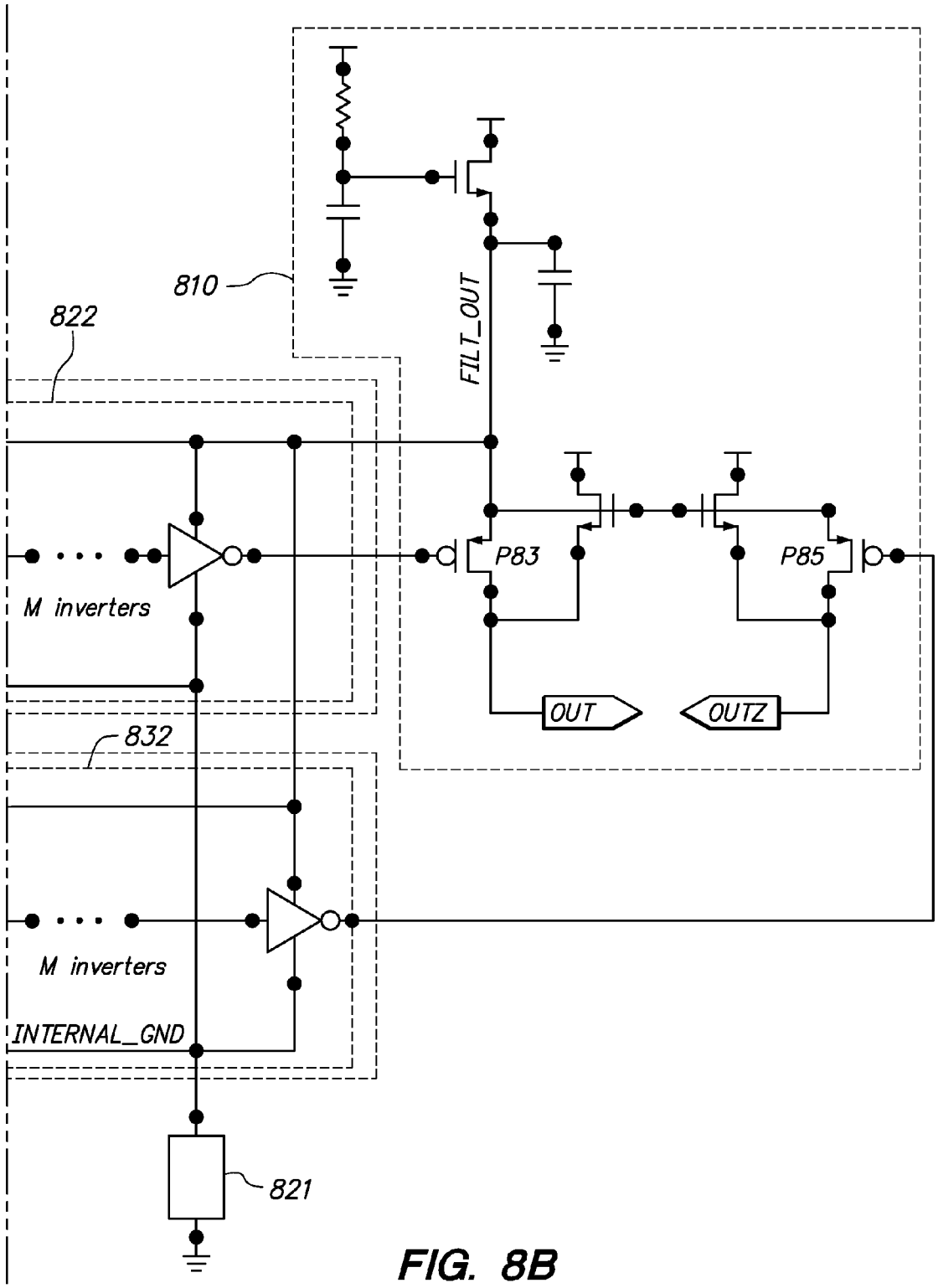

FIG. 8 shows a diagram of a supply-filtered PECL driver that combines the output stage 810 of FIG. 5 with the predriver and level shifter circuits of FIG. 7. Two instances of the predriver and level shifter circuits of FIG. 7 are provided, one (820) for the true input IN and one (830) for the inverted input signal INZ. The predriver circuits 820 and 830 each include a first predriver circuit (820A/830/A) capacitively coupled to a biased inverter stage of a second predriver circuit (822/832). The resulting driver is compact, high-frequency and low-power and exhibits high signal integrity.

The output filter 510 may be replaced with a voltage regulator, described below in relation to FIG. 12, that adjusts the internal supply of the output transistors P81 and P82 and the second predrivers 821 and 831 such that the VOH of the output meets PECL specifications.

The second low voltage predrivers 821 and 831 are configured such that supply voltage across them never exceeds 1.8 v (for a 0.18 um process). The upper rails 823 and 833 of the predrivers are made equal to the source voltage of the output transistors P81 and P82 so they can be turned off for an output low condition. Therefore, the elevated ground regulator 821 must track 1.8 v below the upper rail, node HV_SUPPLY.

Referring to FIG. 9, a diagram is shown of an output driver circuit that uses all thin gate transistors. In this example, each of the thick gate output transistors P83 and P85 in FIG. 8 is replaced by a pair of thin gate output transistors P93/P94 and P95/P96. The thin gate output transistors are configured such that no transistor terminal receives a voltage higher than the specified voltage of 1.8 v (for the case of a 0.18 u CMOS process).

Operating conditions and transistor terminal voltages of the output transistor pairs are as follows:

a. Node IGR operates at a voltage of HV_SUPPLY minus 1.8 v, that is, 1.8 v below the internal rail governed by the high voltage regulator which is near the operating supply.

b. Since node IGR never 1.8 v below HV_SUPPLY, the gate-to-source, and gate-to-bulk voltages of transistors P93 and P95 never exceed 1.8 v, which is the maximum specified for thin gate operation.

c. Since nodes PDOT and PDOTZ swing from HV_SUPPLY to IGR, the maximum swing of the ground elevated predriver is 1.8 v, so the maximum gate-to-source and gate-to-bulk voltages of transistors P94 and P96 is 1.8 v.

d. Since the lowest voltage of PDOT and PDOTZ is HV_SUPPLY minus 1.8 v, the drain voltage of P94 and P95 is never lower than the voltage at node IGR plus the Vt of transistors P94 and P96, so the drain of transistors P94 and P96 never exceeds 1.8 v to the other terminals.

e. Since the ECL specification has a low output voltage VOL of VDD−2V, and the maximum voltage of the high voltage regulator is at most VDD minus 1 Vt due to transistor N91, the drain to gate, bulk, and source of transistors P94 and P96 never exceeds 1.8 v.

Since the foregoing states a-e never exceed 1.8 v, the output transistors may be converted to thin gate.

The area of the output driver circuit implementation using the all thin gate transistor signal paths results in a 10× reduction of output driver circuit area when compared to a thick gate implementation using 0.18 um technology. Furthermore, in one embodiment, the output is operable at voltages in a range of 3.6V-2.3V, and has a maximum frequency of operation fmax above 1.5 GHz at 2.5V operation, compared to less than 800 MHz for a thick gate implementation.

Figure 10:
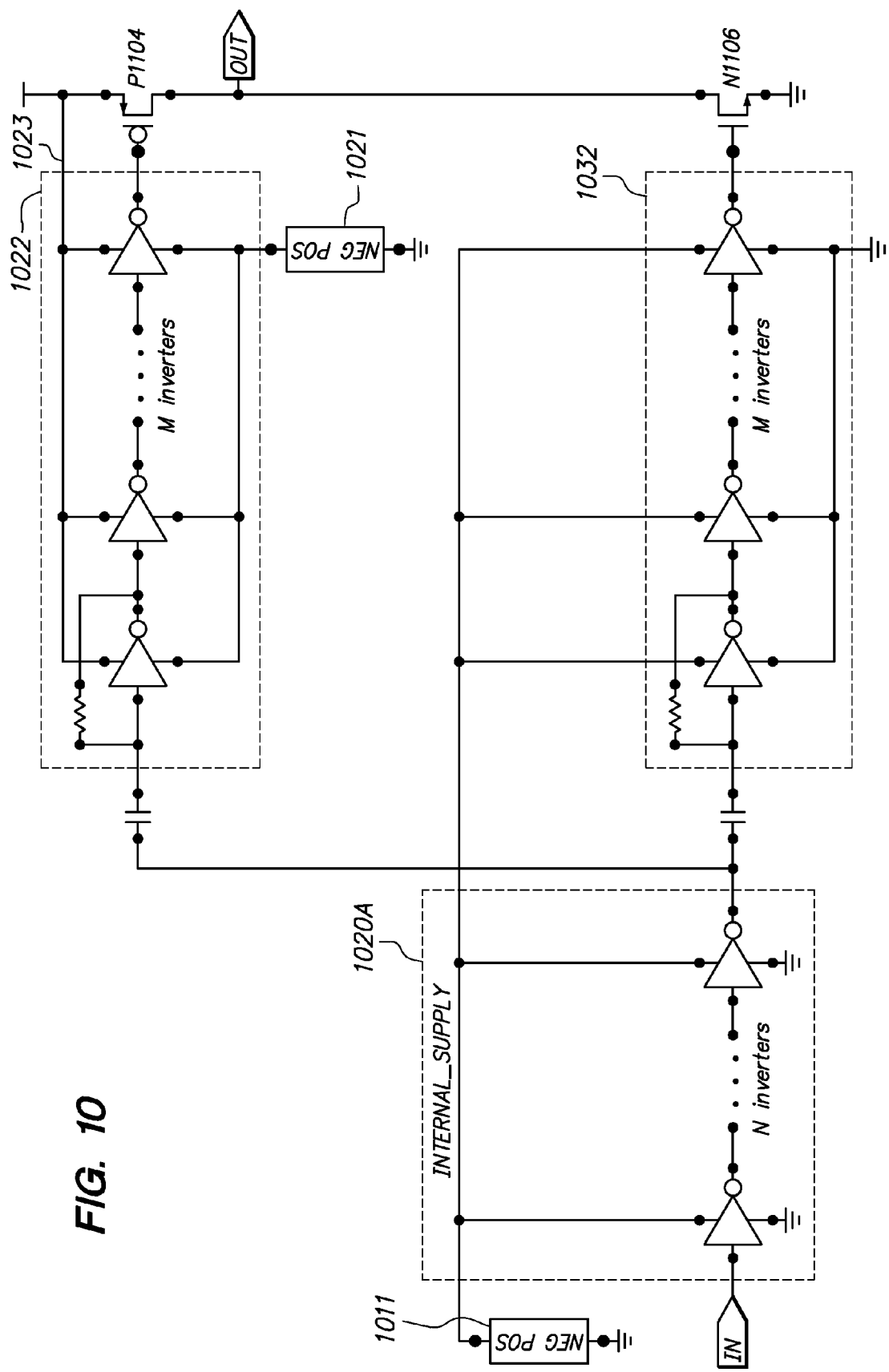
FIG. 10 is a diagram of an output driver circuit for producing CMOS output signals.

The same principles may be applied for CMOS signal levels. FIG. 10 shows a diagram of an output driver circuit like that of FIG. 9 but modified to produce CMOS output signals. In this configuration, the high voltage regulator 910 is removed and the sources of the output transistors P1004 and N1006 and the upper rail 1023 of the second predriver 1022 are connected directly to VDD. In this example, the internal ground regulator 1021 tracks against VDD directly, such that the second predriver 1022 never has an operating voltage above the thin gate maximum.

Also in FIG. 10, a third low voltage regulated predriver 1032 and an output N-channel transistor N1106 are added. The third low voltage predriver 1032 is coupled, in the same manner as the second predriver 1022, to the first predriver 1020A. The third predriver 1032 is coupled to the same low voltage internal regulator 1011 as the first predriver 1020A, and drives the N-channel output transistor N1106.

Figure 11:
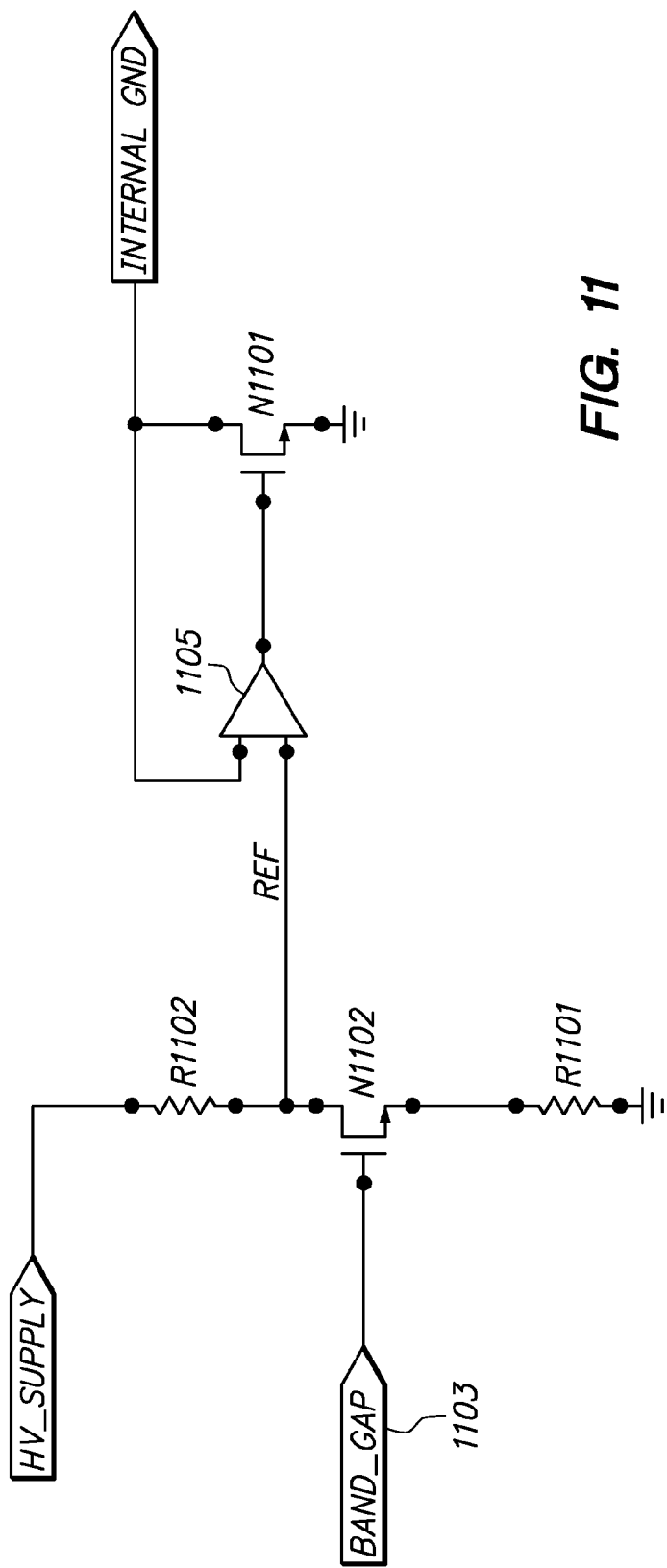
FIG. 11 is a diagram of an elevated ground regulator that may be used in the circuit of FIG. 9.

FIG. 11 shows a diagram of one possible implementation of the internal elevated ground regulator 921.

In this implementation a constant current is created by a constant voltage reference, such as a bandgap regulator output 1103, and by transistor N1102 and resistor R1101. The constant current is driven into resistor R1102, which is connected to the high voltage supply. In this configuration, the constant current across resistor R1102 creates a constant voltage that is referenced to the high voltage regulator voltage.

The constant voltage created across resistor R1102 is set to be the maximum operating voltage of the thin gate transistors and is used as a reference for the differential amplifier 1105 such that the amplifier and transistor N1101 force the internal ground to track to the correct voltage.

Figure 12:
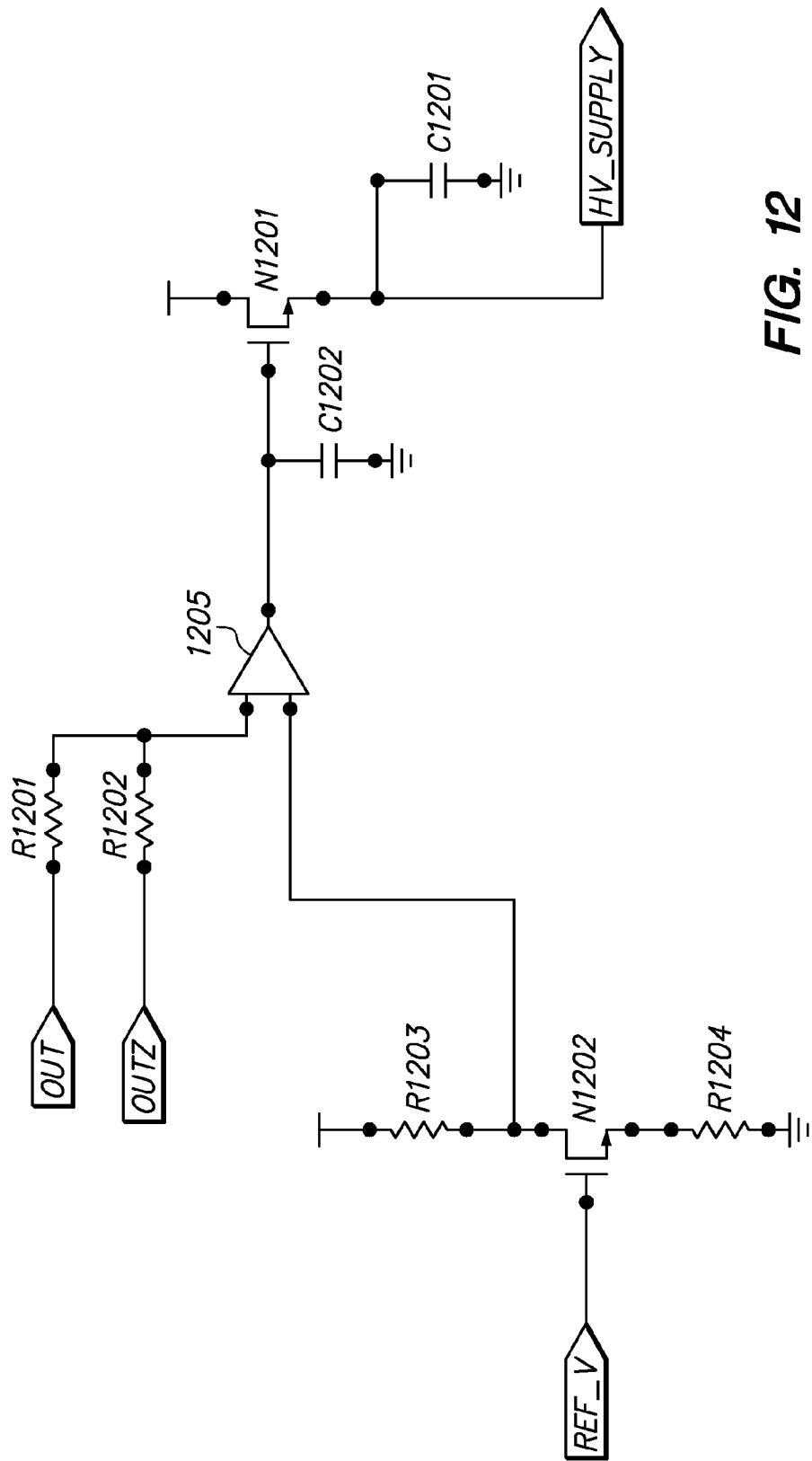
FIG. 12 is a diagram of a high voltage supply regulator that may be used in the circuit of FIG. 9.

FIG. 12 shows a diagram of one possible implementation of the high voltage regulator 910.

This circuit takes the signals OUT and OUTZ (the true and complement forms of the output) and feeds them into a differential amplifier 1205 in a common mode fashion. That common mode voltage is forced to the same voltage as a reference voltage created by R1203, R1204, and N1202. The reference voltage is set such that the common mode voltage of the output results in the specified PECL high output voltage VOH. An alternate version could replace the common mode feedback with a signal from a peak detector that would set VOH directly.

Since the high voltage supply output is a large N-channel transistor N1201, and since the output impedance of the differential amplifier 1205 is very high, placing a large capacitance at the gate of N121 will result in a low pass filter integrated into the supply with a bandwidth determined by the amplifier's impedance and the large capacitor C1202. The filter helps in reducing mixing products produced on the output spectrum caused by any VDD noise. Capacitor C1201 acts as a bypass capacitor.

Figure 13:
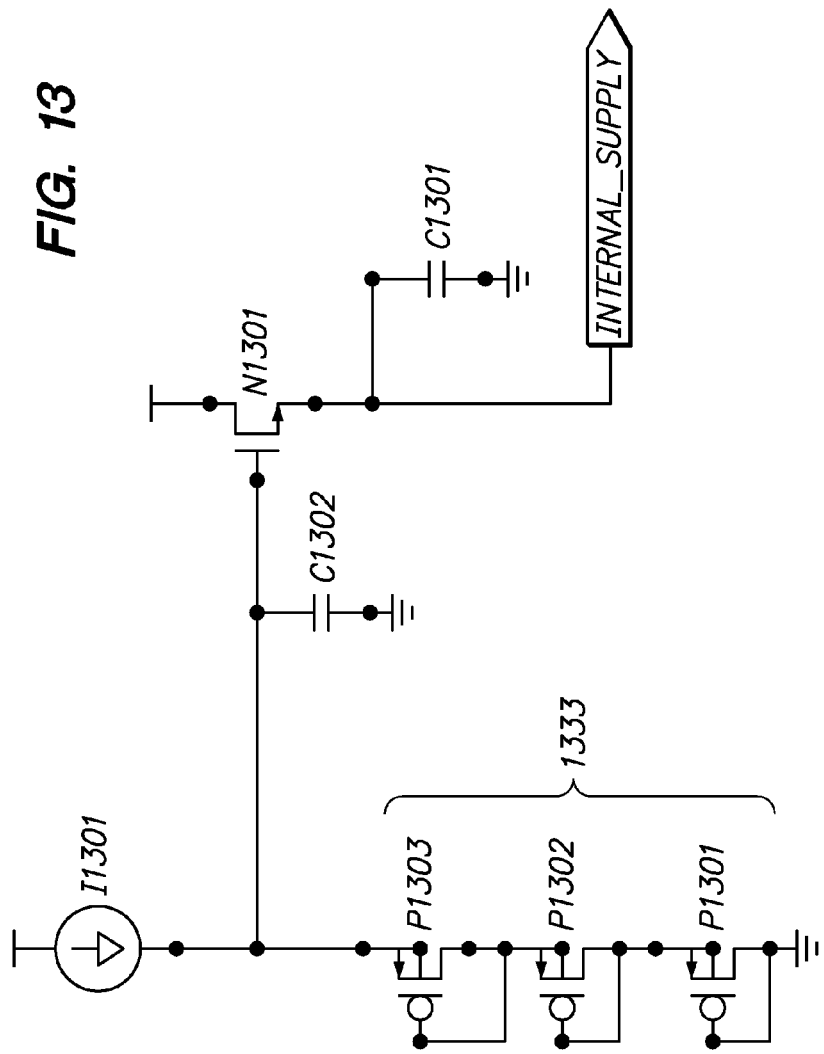
FIG. 13 is a diagram of a low voltage internal supply regulator that may be used in the circuit of FIG. 9.

FIG. 13 shows a diagram of one possible implementation of the low voltage, ground referenced regulator 911.

The low voltage, ground referenced regulator 911 for the first predrivers 920A and 930A is configured by a current source, I1301, using a bandgap or other reference voltage as discussed above. The current source I1301 feeds a stack 1333 of diode connected P-channel transistors (P1301, P1302, P1303) such that a relatively constant voltage is created. By connecting a large N-channel transistor N1301 to the constant voltage, a relatively constant voltage regulator is created. This low voltage is set through the value of current source I1301 and size of the transistors used in the diode stack 1333 such that the regulator output never exceeds the maximum operating voltage of the thin gate transistors.

Since the current source I1301 has a high output impedance, placing a large capacitor at the gate of transistor N131 forms an active low pass filter at the output, with the bandwidth determined by the current source output impedance and the value of the capacitor C1301. This filter reduces supply noise that can mix down at the outputs of the first predrivers.

Figure 14:
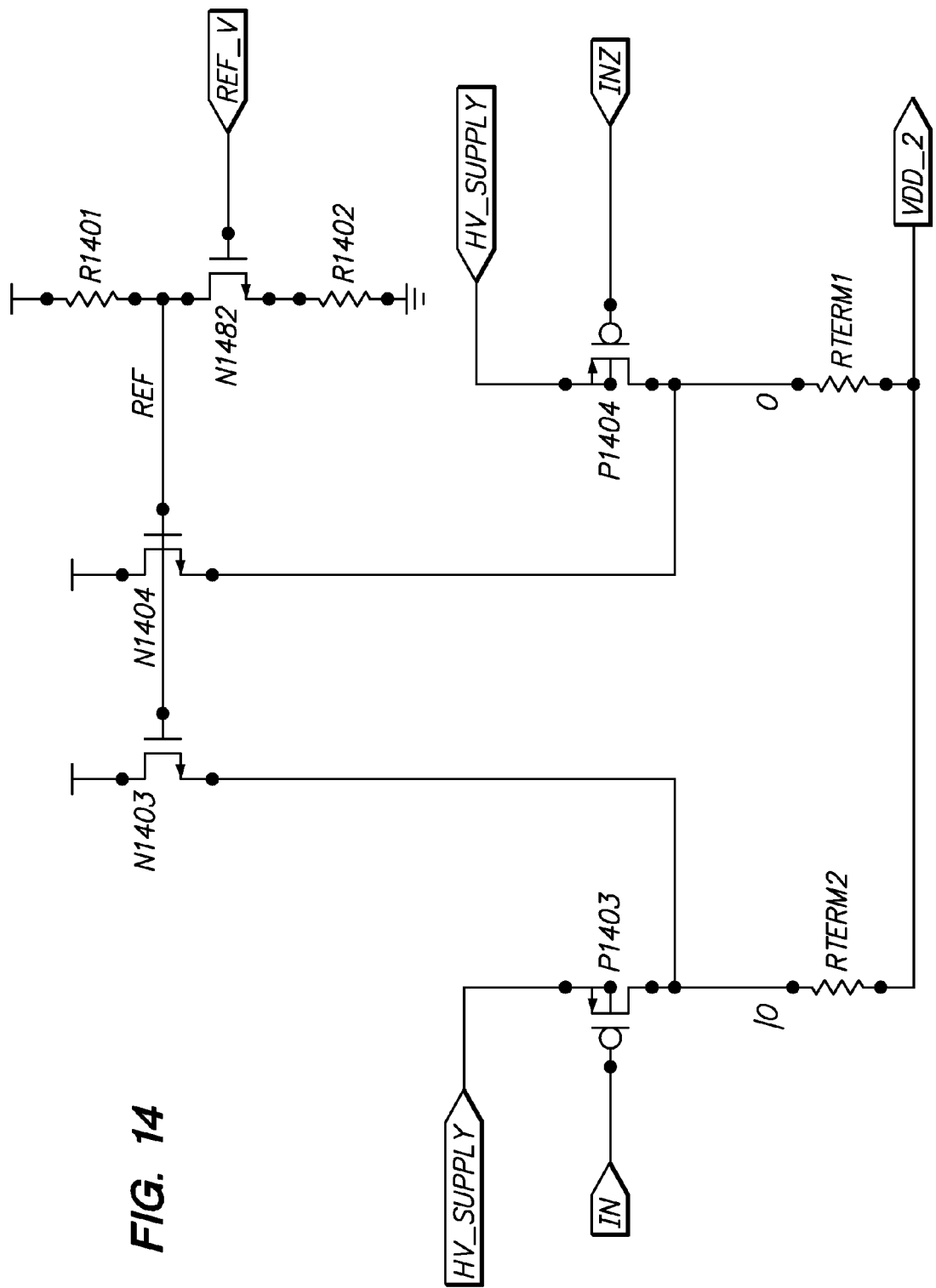
FIG. 14 is a diagram of a VOL clamp that may be used in the circuit of FIG. 9.

FIG. 14 shows a diagram of one possible implementation of the VOL clamp 920.

It consists of a reference voltage, created in a similar manner as described above by resistors R1401, R1402 and transistor N1482, and transistors P1403 and P1404. Transistors P1403 and P1404 are the output transistors, and resistors RTERM1, RTERM2 are off chip resistors providing termination as specified for PECL outputs.

The clamp works by setting the voltage at node REF to be the voltage specified for PECL VOL plus the Vt of transistors P1403 and P1404. Since the PECL VOL specification is VDD−1.83 to VDD−1.62 v the voltage at node ref is set to VDD−1.72 v+Vt of transistors P1403 and P1404, such that when the clamp transistors P1403 or P1404 turn on, the voltage at their sources will be VDD−1.72V In the case where node O, which is the true output of the buffer (|O is the complement output of the buffer), is desired to be low, transistor P1404 is turned off, and the termination resistor, RTERM1, pulls down on the node towards the termination voltage specified by the PECL specification as VDD−2 v. Once the node falls to near VDD−1.72 v, transistor P1402 will come on and source current to the load, clamping the node to VDD−1.72 v.

During this period, transistor P1403 is turned on, sourcing current to termination resistor, RTERM2, and holds the node |O to the HV_SUPPLY voltage which is at the specified PECL VOH voltage plus the drop across the source to drain of transistor P1403. Since that voltage is well above VDD−1.72V, transistor N1403 is off.

Figure 15:
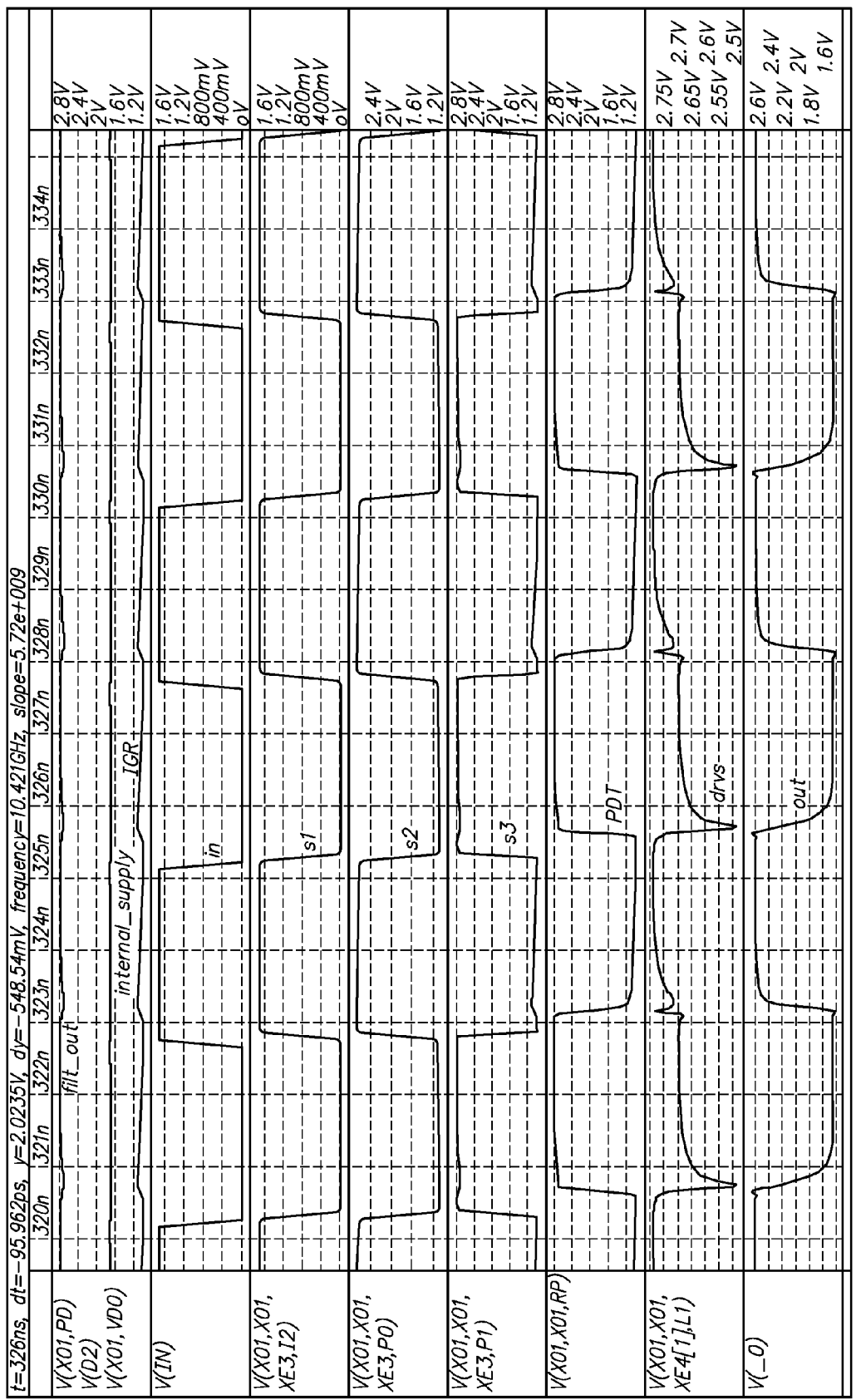
FIG. 15 is a first waveform diagram illustrating operation of the circuit of FIG. 9.

FIGS. 15, 16A and 16B illustrate waveforms at selected nodes of the circuit of FIG. 9 during operation. Waveforms for the nodes of the complement output side of the circuit of FIG. 9 are not shown but are 180 degrees output of phase with respect to the illustrated waveforms. In FIG. 15, the waveforms are separated, whereas in FIG. 16A and FIG. 16B, the waveforms are shown in overlapping fashion.

FIG. 16A shows key operating voltages for both the internal regulated predriver 920A and the ground regulated predriver 922. Node waveform descriptions are set forth in the following table:

| NODE | WAVEFORM DESCRIPTION |
|---|---|
| VDD | External supply voltage |
| INTERNAL_SUPPLY | Operating voltage of the first predriver. All AC nodes of the first predriver, including the input, will swing between this voltage (~1.8 V) and ground. Since this supply is at 1.8 V or below, all thin-gate transistors can be used. |
| IN | Signal waveform at the input of the first predriver. Signal swing = 0 to INTERNAL_SUPPLY (~1.8 V). |
| S1 | Signal waveform at the output of the first predriver. Signal swing = 0 to INTERNAL_SUPPLY (~1.8 V). |
| FILT_OUT/ HV_SUPPLY | Output voltage of the high voltage supply regulator (~2.8 V). All AC nodes on the second predriver will swing up to this voltage. The output transistor pairs will also attempt to bring the output to this voltage. |
| IGR | Internal ground for the second predrivers. This voltage tracks the upper rail of the second predrivers (FILT_OUT) such that the predrivers operate at 1.8 V. That is, since the upper rail for the second predrivers is 2.8 V, the internal grounds should be at 1 V as shown. All AC nodes of the second predrivers will therefore swing between IGR (~1 V) and FILT_OUT (2.8 V). Note that these voltages relate to the external supply voltage (VDD) of 3.3 V. Lowering VDD to 3 V will lower FILT_OUT to 2.5 V and IGR to 0.7 V, which still maintains 1.8 V operation of the second predrivers. |
| S2 | Shows the input signal of the second predriver which has been level shifted to the operating voltages of the second predriver by the coupling capacitor and bias resistor. |
| S3 | Shows the output signal of the first inverter of the second predriver, further illustrating the ~1.8 V signal swing between the two internal rails (IGR and FILT_OUT). |

The foregoing waveforms show the voltages and signal swings of both predrivers operating at 1.8V, allowing the use of thin gate transistors. Note that there are no signals above 1.8V, even in the translation between the predrivers.

FIG. 16B shows key operating voltages for the output driver stage (transistor pairs P93/P94 and P95/P96). Node waveform descriptions are set forth in the following table:

| NODE | WAVEFORM DESCRIPTION |
|---|---|
| VDD | External supply voltage |
| FILT_OUT/ HV_SUPPLY | Output voltage of the high voltage supply regulator (~2.8 V). All AC nodes on the second predriver will swing up to this voltage. The output transistor pairs will also attempt to bring the output to this voltage. |
| IGR | Internal ground for the second predrivers. This voltage tracks the upper rail of the second predrivers (FILT_OUT) such that the predrivers operate at 1.8 V. That is, since the upper rail for the second predrivers is 2.8 V, the internal grounds should be at 1 V as shown. All AC nodes of the second predrivers will therefore swing between IGR (~1 V) and FILT_OUT (2.8 V). |

-continued

| NODE | WAVEFORM DESCRIPTION |
|------|----------------------|
|      | Note that these voltages relate to the external supply voltage (VDD) of 3.3 V. Lowering VDD to 3 V. will lower FILT_OUT to 2.5 V and IGR to 0.7 V, which still maintains 1.8 V operation of the second predrivers. |
| PDOT | Output of the second predriver. Same 1.8 V signal swing as S2 and S3. This signal drives the gate of the output transistor P94. |
| DRVS | Signal node between the output transistor pair, showing that transistor P93 has no port-to-port voltages exceeding 1.8 V. |
| OUT  | PECL output signal, swinging to the desired voltages with no transistor port-to-port voltages exceeding 1.8 V |

Note that in the circuit of FIG. 9, there is no voltage swing translation. That is, every AC node in the circuit swings no more than 1.8V and therefore requires no swing translation. Also, the biased inverter is integral to the second low voltage predriver stage, and is not a stand-alone block.

Furthermore, the described high frequency output buffer circuit, in an exemplary embodiment, uses two predriver stages operating off two different sets of rails. Both stages are fully regulated, and operate at low voltage, using high bandwidth thin gate transistors. If a single predriver were used, since a single predriver includes the total gain of the buffer, any noise present on the predriver supply line would be mixed down at the output pad. By instead dividing the predriver, the gain of the predriver driving the output transistors is effectively reduced by the amount of gain in the first predriver, which is on the same supply as the internal circuitry.

In the same exemplary embodiment, the first predriver stage operates at a reduced internal voltage such that high bandwidth, thin gate transistors may be used, which substantially reduces power, die area, and increases predriver bandwidth/maximum operating frequency;

In the same exemplary embodiment, the second predriver stage is regulated by a supply referenced ground regulator. The ground regulator elevates the ground potential of the associated circuits such that the signal swing of the second predriver tracks the high voltage supply regulator. The elevated ground voltage tracks the high voltage, and therefore the source of the output of the output transistor and second predriver such that the signal swing is low voltage (1.8 v). This low voltage signal swings the gate of the output P-channel transistor from its source voltage to 1.8 v below the source voltage, thereby switching the transistor. This second predriver is also composed entirely of high bandwidth, thin gate transistors.

The foregoing architecture allows the signal path from the internal circuitry to a highly loaded output to be composed entirely of high bandwidth thin gate transistors, which thereby significantly increases maximum operating frequency over a wider range of voltage, as well as reduces the die area by about 7× for a 0.18 um technology.

Although embodiments of the present invention have been described in detail, it should be understood that various changes, substitutions and alternations can be made without departing from the spirit and scope of the inventions as defined by the appended claims.

What is claimed is:

1. A method of producing an oscillatory output signal having a peak voltage of V volts using MOS transistor circuitry transistors of which are designed for a maximum port-to-port voltage of substantially less than V volts, the method comprising:

applying current amplification to an input signal using a first inverter chain to produce a predriver output signal;

AC-coupling the predriver output signal to a second inverter chain and translating the predriver output signal to a higher voltage range to produce a translated predriver output signal;

applying current amplification to the translated predriver output signal using the second inverter chain to produce a driver output signal; and using the driver output signal to control a driver transistor to produce the oscillatory output signal while ensuring that no port-to-port voltage of the driver output transistor exceeds the maximum port-to-port voltage.

2. The method of claim 1, wherein the driver transistor is a P-type transistor.

3. The method of claim 1, comprising producing an elevated reference voltage and applying the elevated reference voltage to the second inverter chain.

4. The method of claim 3, comprising:

regulating a supply voltage to produce a second regulated supply voltage and applying the second regulated supply voltage to the second inverter chain; and producing an elevated reference voltage and applying the elevated reference voltage to the second inverter chain.

5. The method of claim 1, comprising regulating a supply voltage to produce a first regulated supply voltage and applying the first regulated supply voltage to the second inverter chain.

6. The method of claim 5, comprising regulating the supply voltage to produce a second regulated supply voltage and applying the second regulated supply voltage to the second inverter chain.

7. The method of claim 1, comprising biasing a first inverter of the second inverter chain using a bias resistor coupled from an output of the first inverter to an input of the first inverter.

8. The method of claim 1, wherein the maximum port-to-port voltage is about 1.8 volts or less.

9. The method of claim 1, wherein V is about 2.6V.

10. The method of claim 1, wherein the output signal comprises a substantial DC output current.

11. The method of claim 1, wherein the substantial DC output current is about 22 milliamps.

12. The method of claim 1, wherein the output signal is a PECL output signal.

13. Circuitry for producing an oscillatory output signal having a peak voltage of V volts using MOS transistor circuitry transistors of which are designed for a maximum port-to-port voltage of substantially less than V volts, comprising:

a first inverter chain coupled to an input signal to produce a predriver output signal;

a second inverter chain comprising a plurality of inverters including a first inverter, the second inverter chain for producing a driver output signal;

circuitry for AC-coupling the predriver output signal to the second inverter chain, the circuitry for AC-coupling and the first inverter of the second inverter chain being configured to translate the predriver output signal to a higher voltage range to produce a translated predriver output signal;

a driver transistor controlled using the driver output signal to produce the oscillatory output signal; and circuitry coupled to the driver output transistor for ensuring that no port-to-port voltage of the driver output transistor exceeds the maximum port-to-port voltage.

14. The circuitry of claim 13, wherein the driver transistor is a P-type transistor.

15. The circuitry of claim 13, comprising a first supply voltage regulator circuit for producing a first regulated supply voltage and applying the first regulated supply voltage to the second inverter chain.

16. The circuitry of claim 13, comprising a reference voltage regulator circuit for producing an elevated reference voltage and applying the elevated reference voltage to the second inverter chain.

17. The circuitry of claim 15, comprising a second supply voltage regulating circuit for producing a second regulated supply voltage and applying the second regulated supply voltage to the second inverter chain.

18. The circuitry of claim 16, comprising:
   a second supply voltage regulating circuit for producing a second regulated supply voltage and applying the second regulated supply voltage to the second inverter chain; and
   a reference voltage regulator circuit for producing an elevated reference voltage and applying the elevated reference voltage to the second inverter chain.

19. The circuitry of claim 13, wherein the first inverter of the second inverter chain is a biased inverter comprising a bias resistor coupled from an output of the first inverter to an input of the first inverter.

20. The circuitry of claim 13, wherein the maximum port-to-port voltage is about 1.8 volts or less.

21. The circuitry of claim 13, wherein V is about 2.6V.

22. The circuitry of claim 13, wherein the output signal comprises a substantial DC output current.

23. The circuitry of claim 13, wherein the substantial DC output current is about 22 milliamps.

24. The circuitry of claim 13, wherein the output signal is a PECL output signal.

* * * * *